United States Patent
Baumgartner et al.

(10) Patent No.: US 6,580,279 B1
(45) Date of Patent: Jun. 17, 2003

(54) METHOD AND APPARATUS FOR CHECKING THE CAPACITANCE OF A STORAGE CAPACITOR PROVIDED IN AN OCCUPANT PROTECTION SYSTEM

(75) Inventors: Walter Baumgartner, Zeitlarn (DE); Klaus Bauer, Regensburg (DE); Stefan Hermann, Köfering (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/323,565

(22) Filed: Jun. 1, 1999

(30) Foreign Application Priority Data

May 29, 1998 (EP) .............................. 98109869

(51) Int. Cl.[7] .............................. G01R 27/26; B60L 1/00
(52) U.S. Cl. ...................... 324/678; 324/677; 324/502; 307/10.1
(58) Field of Search ................ 324/502, 677, 324/500, 519, 678; 307/10.1

(56) References Cited

U.S. PATENT DOCUMENTS

| 3,629,816 A | * | 12/1971 | Gillund et al. ............ 180/271 |
| 3,761,805 A | * | 9/1973 | Dornberger ................ 324/677 |
| 4,243,933 A | * | 1/1981 | Rollman ................... 324/678 |
| 4,835,513 A | * | 5/1989 | McCurdy et al. ........... 340/438 |
| 5,073,757 A | * | 12/1991 | George ..................... 324/677 |
| 5,225,985 A | * | 7/1993 | Okano ........................ 701/46 |
| 5,327,014 A | * | 7/1994 | Huber et al. ............... 307/10.1 |
| 5,446,442 A | * | 8/1995 | Swart et al. ............... 340/438 |

FOREIGN PATENT DOCUMENTS

| DE | 19508850 A1 | 9/1996 |
| DE | 19634320 A1 | 2/1998 |
| EP | 0338413 A2 | 10/1989 |

* cited by examiner

Primary Examiner—Kamand Cuneo
Assistant Examiner—Paresh Patel
(74) Attorney, Agent, or Firm—Laurence A. Greenberg; Werner H. Stemer; Gregory L. Mayback

(57) ABSTRACT

A capacitance of a firing capacitor for the firing of a firing pellet, where the firing capacitor is contained in an occupant protection system of a motor vehicle, is implemented on a rising edge of a capacitor voltage in a charging phase. For this purpose, a quantity of charge taken up by the storage capacitor during a test time interval is determined by measurement of a charge current or of a corresponding value and integration over the test time interval. The capacitance is obtained through a quotient of the resultant integral and a voltage change in the capacitor voltage that occurred in the test time interval. The functional availability of the firing capacitor is not adversely affected at any time during the testing.

9 Claims, 3 Drawing Sheets

METHOD AND APPARATUS FOR CHECKING THE CAPACITANCE OF A STORAGE CAPACITOR PROVIDED IN AN OCCUPANT PROTECTION SYSTEM

BACKGROUND OF THE INVENTION

Field of the Invention

The invention relates to a method for checking the capacitance of a storage capacitor provided in an occupant protection system. Furthermore, the invention relates to a test apparatus for checking the capacitance. The invention is concerned, in particular, with occupant protection systems in motor vehicles, such as restraint systems, for example seatbelt pretensioner systems, or airbag systems.

An occupant protection system of a motor vehicle must trigger reliably in the event of an accident. To that end, one or a plurality of storage capacitors is or are provided, and it or they ensure sufficient power for the firing of firing pellets, by way of example. The power supply is also ensured in an emergency in the event of the failure of an energy source operated from the on-board electrical system. Such storage capacitors can also be used as auxiliary voltage sources for electronic circuits or the like. In order to guarantee the functionality of the occupant protection system, it must be ensured that the capacitance of the storage capacitor used, in particular, the firing capacitor is sufficient. Therefore, it is necessary to check the capacitance of such storage capacitors after the latter have been fitted or else after an occasion or each occasion where the occupant protection system has been activated.

Published, Non-Prosecuted German Patent Application DE 195 08 850 A1 discloses a method for checking the capacitance of a storage capacitor and a test apparatus. Accordingly, the capacitance of the storage capacitor is checked by the storage capacitor, which is charged by a voltage source after activation, and then being disconnected from the voltage source and discharged by a discharge circuit with a defined discharge current over a specific test time interval or measurement duration. From the discharge current and the test time, the change in the capacitor charge is determined by multiplication and divided by an acquired change in the capacitor voltage, in order to determine the capacitance in this way. In the event of an erroneous determination of the capacitance, there is the risk of the storage capacitor being discharged to such an extent that it is no longer functional. Therefore, the known test apparatus contains a protection circuit that terminates the determination of the capacitance if the capacitor voltage falls below a minimum value. Since the storage capacitor must still be able to supply sufficient energy at the minimum voltage value as well and must be able to be charged to a higher voltage value, from which it is discharged in order to measure the capacitance, with the available voltage source, it has to be dimensioned to be larger than is actually necessary, which increases the space requirement of the known test apparatus. The additionally required circuits, that is to say the protection circuit and the discharge circuit, necessitate further outlay and a greater space requirement of the test apparatus. Moreover, the test operation requires a relatively long time owing to the charging, discharging and renewed charging of the storage capacitor to the operating-voltage. Overall, the known method is complicated and the test device that can be used for that purpose is very complex and therefore expensive. The most serious disadvantage of the known capacitance checking, however, is the consumption of valuable stored energy necessitated by the measurement.

SUMMARY OF THE INVENTION

It is accordingly an object of the invention to provide a method for checking the capacitance of a storage capacitor provided in an occupant protection system, and also a test apparatus which overcomes the above-mentioned disadvantages of the prior art methods and devices of this general type, which method and which apparatus permit checking without the consumption of the energy stored in the storage capacitor after charging, and are associated with a low outlay.

With the foregoing and other objects in view there is provided, in accordance with the invention, a method for checking a capacitance of a storage capacitor including a firing capacitor for firing a firing pellet of an occupant protection system, which includes:

determining a quotient from a change in a charge of a storage capacitor and an associated change in a voltage of the storage capacitor during a charging phase of the storage capacitor; and determining a capacitance of the storage capacitor from the quotient and the associated change in the voltage of the storage capacitor.

According to the invention, a determination of the capacitance is implemented on a rising edge of the capacitor voltage curve in the charging phase. As a result, the measured storage capacitor is fully functionally available after the determination of the capacitance, without having to be recharged. The charge change in the capacitor charge which is necessary for determining the capacitance is in this case determined by way of the charging current rather than by way of a defined discharge current. The charging current, which flows in any case during a charging phase from a charge carrier source to the capacitor, does not have to be generated in addition, but rather is merely determined during the measurement duration in order to find the change in the capacitor charge. If the change in the capacitor voltage that has occurred during the measurement duration is additionally determined, the capacitance of the capacitor can be calculated from the quotient of the changes of capacitor charge and capacitor voltage.

Unlike in previously known methods, an undesirably non-timely ending of the measurement or determination of the capacitance has no influence on the functionality of the storage capacitor, since the latter, with or without measurement, is charged completely. The invention enables the capacitance to be determined without a separate discharge circuit and protection circuit. The storage capacitor need not be overdimensioned for reasons of measuring the capacitance. Overall, a test apparatus with little additional space requirement and outlay on hardware can thus be realized.

In a preferred embodiment, the charging current is limited by a defined charging resistor between the charge carrier source and the storage capacitor, with the result that the charging phase is extended and sufficient time and more favorable current and/or voltage profiles are available for the determination of the capacitance. The charging current is then preferably determined by way of a measured voltage drop across the charging resistor. The charge change in the capacitor charge is preferably obtained by at least approximate integration of the charging current over the measurement duration, i.e., in the case of a voltage tap on the charging resistor, by integration of the voltage drop over the test time interval and division by the resistance of the charging resistor.

By the determination of the capacitor voltage in the charging phase, which determination is effected in order to ascertain the voltage change in the capacitor voltage, it is also additionally possible, in a preferred refinement of the invention, to monitor the charging operation and, for example, to ascertain early on whether the charging path is interrupted or whether or when the storage capacitor has stored sufficient energy.

Other features which are considered as characteristic for the invention are set forth in the appended claims.

Although the invention is illustrated and described herein as embodied in a method for checking the capacitance of a storage capacitor provided in an occupant protection system, and also a test apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
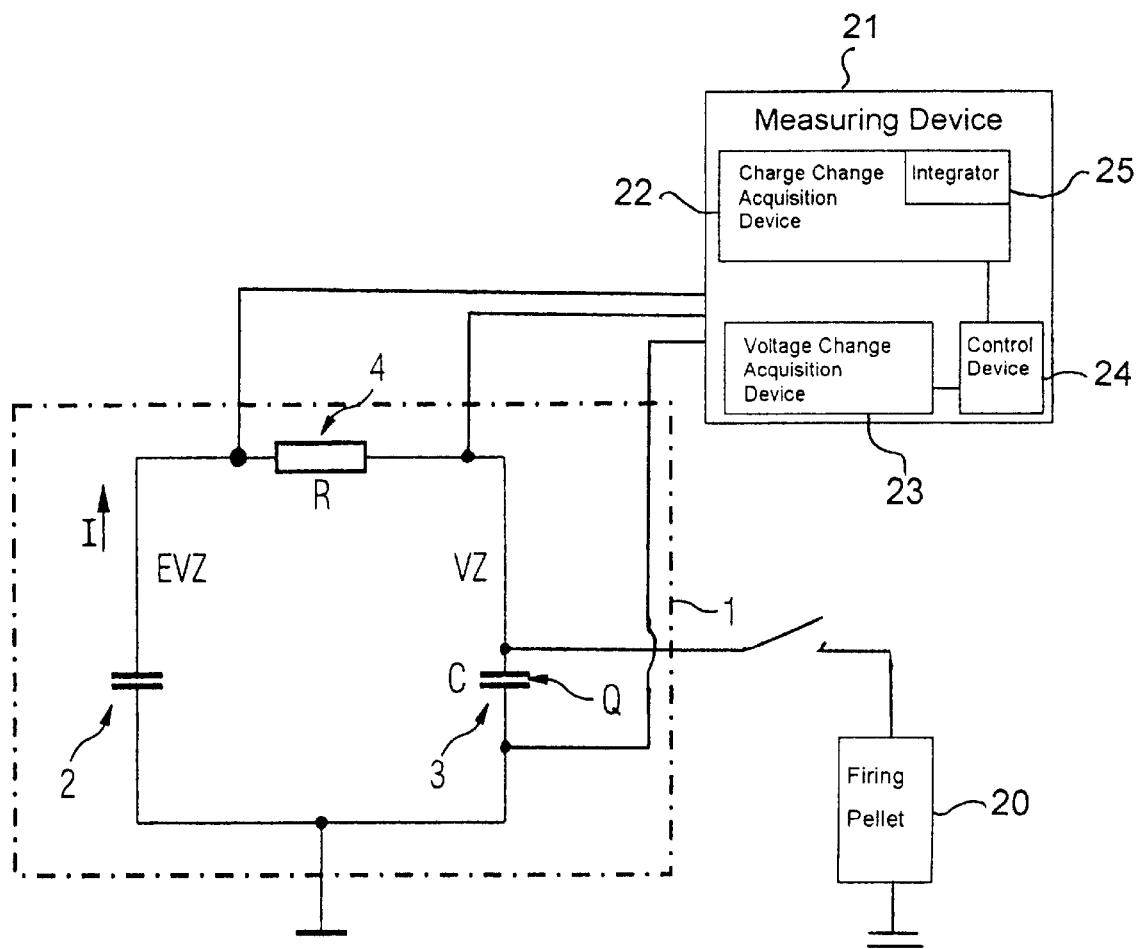
FIG. 1 is a diagrammatic, block diagram of a test apparatus for an occupant protection system in accordance with a first embodiment of the invention.

In all the figures of the drawing, sub-features and integral parts that correspond to one another bear the same reference symbol in each case. Referring now to the figures of the drawing in detail and first, particularly, to FIG. 1 thereof, there is shown a test apparatus 1 that is part of an occupant protection system of a motor vehicle and receives signals from one or more non-illustrated accident sensors disposed in the motor vehicle. The test apparatus 1 is connected to an on-board electrical system for supplying energy and is provided with a non-illustrated microprocessor that evaluates signals from the accident sensors and activates firing pellet 20 connected to the test apparatus 1 for example the firing pellet 20 of an airbag, in the event of an accident being detected. It is also possible for a plurality of firing pellets 20 to be connected to the test apparatus 1 for the purpose of firing governed by the hazard situation.

The test apparatus 1 is a control unit containing a voltage source 2. The voltage source 2 draws its input energy from an on-board electrical system of the motor vehicle and charges a firing capacitor 3, which is connected in parallel with the voltage source 2, to a predetermined voltage. The voltage source 2 thus acts as a charge carrier source for the firing capacitor 3. The voltage source 2 may be a voltage generator which outputs a higher voltage than the on-board electrical system voltage as a charging voltage or source voltage for the firing capacitor 3. Instead of the voltage source 2, a current source may also be used as the charge carrier source for charging the firing capacitor 3 to a predetermined voltage value. The firing capacitor 3 serves as a storage capacitor that also ensures sufficient firing power and guarantees an emergency power supply for the occupant protection system for the firing of the firing pellet 20 in the event of the failure of the on-board electrical system. Instead of the firing capacitor 3, the storage capacitor formed by a combination of a plurality of firing capacitors connected in parallel or in series may also be present.

A charging resistor 4 is connected in series between the voltage source 2 and the firing capacitor 3. The charging resistor 4 has a defined resistance R and is part of a circuit for charging of the firing capacitor 3 by the voltage source 2, where it limits a charging current flowing from the voltage source 2 to the firing capacitor 3.

The capacitance C of the firing capacitor 3 is checked by measurement of current and/or voltage and by software stored in the microprocessor being a control device 24 of the test apparatus 1. Overall, the test apparatus 1 has a test timing and measuring device 21, a voltage change acquisition 23 device and a charge change acquisition device 22.

After activation of the on-board electrical system, the device 21 receives a control signal indicating a beginning of a normal mode, thereupon initiates a test or a measurement for checking the capacitance C and ends the test after a specific test time interval. As is evident from FIG. 2, the device 21 is timed in such a way that both a start instant $t_{start}$ and an end instant $t_{end}$ of the measurement are within a charging phase of the firing capacitor 3. As is evident from the lower diagrams in FIG. 2, the start instant $t_{start}$ is after the activation of the on-board electrical system or the beginning of the charging of the capacitor, so that the system, as known per se, initially carries out a self-test, passing of which is a precondition for the further sequence of events.

On the basis of instantaneous values of a capacitor voltage VZ which are acquired by measurement of a potential of a line between the charging resistor 4 and the firing capacitor 3, the voltage change acquisition device 23 determines a voltage change ΔVZ in the capacitor voltage VZ between the start instant $t_{start}$ and the end instant $t_{end}$ of a test duration, which lasts for 1.8 s, for example.

The charge change acquisition device 22 determines the charge change ΔQ in the capacitor charge Q between the start instant $t_{start}$ and the end instant $t_{end}$ of the test time interval. For this purpose, the charge change acquisition device 22 has a charging current acquisition device, which determines a charging current I or a value corresponding thereto during the test time interval. The charge change acquisition device 22 further has an integrating device 25 for generating an integral of the charging current I or of a value corresponding to the charging current over the test time interval. On the basis of a potential which is measured on a line between the voltage source 2 and the charging resistor 4 by the voltage acquisition device 23 and corresponds to the source voltage EVZ of the voltage source 2, and on the basis of the potential which is measured on the line between the charging resistor 4 and the firing capacitor 3 by the voltage acquisition device 23 and corresponds to the capacitor voltage VZ, the charging current acquisition device 22 determines the voltage drop across the charging resistor 4, i.e. the voltage (EVZ–VZ) present across the charging resistor 4. The integrating device 25 integrates the voltage (EVZ–VZ) which is present across the charging resistor 4 and corresponds to the charging current I according to Ohm's Law over the test time interval. From the resultant integral and the resistance R of the charging resistor 4, the charge change acquisition device 22 determines a change ΔQ in the capacitor charge Q according to the following equation:

$$\Delta Q = \int I x dt = R^{-1} \times \int (EVZ - VZ) x dt \qquad (1)$$

or, more precisely, according to the following equation:

$$\Delta Q = \int_{t_{start}}^{t_{end}} I x dt = R^{-1} x \int_{t_{start}}^{t_{end}} (EVZ - VZ) x dt. \qquad (1')$$

From the change ΔQ in the capacitor charge and the change ΔVZ in the capacitor voltage, the test apparatus determines the capacitance of the firing capacitor 3 according to the following equation:

$$C = \Delta Q / \Delta VZ \qquad (2)$$

Figure 2:
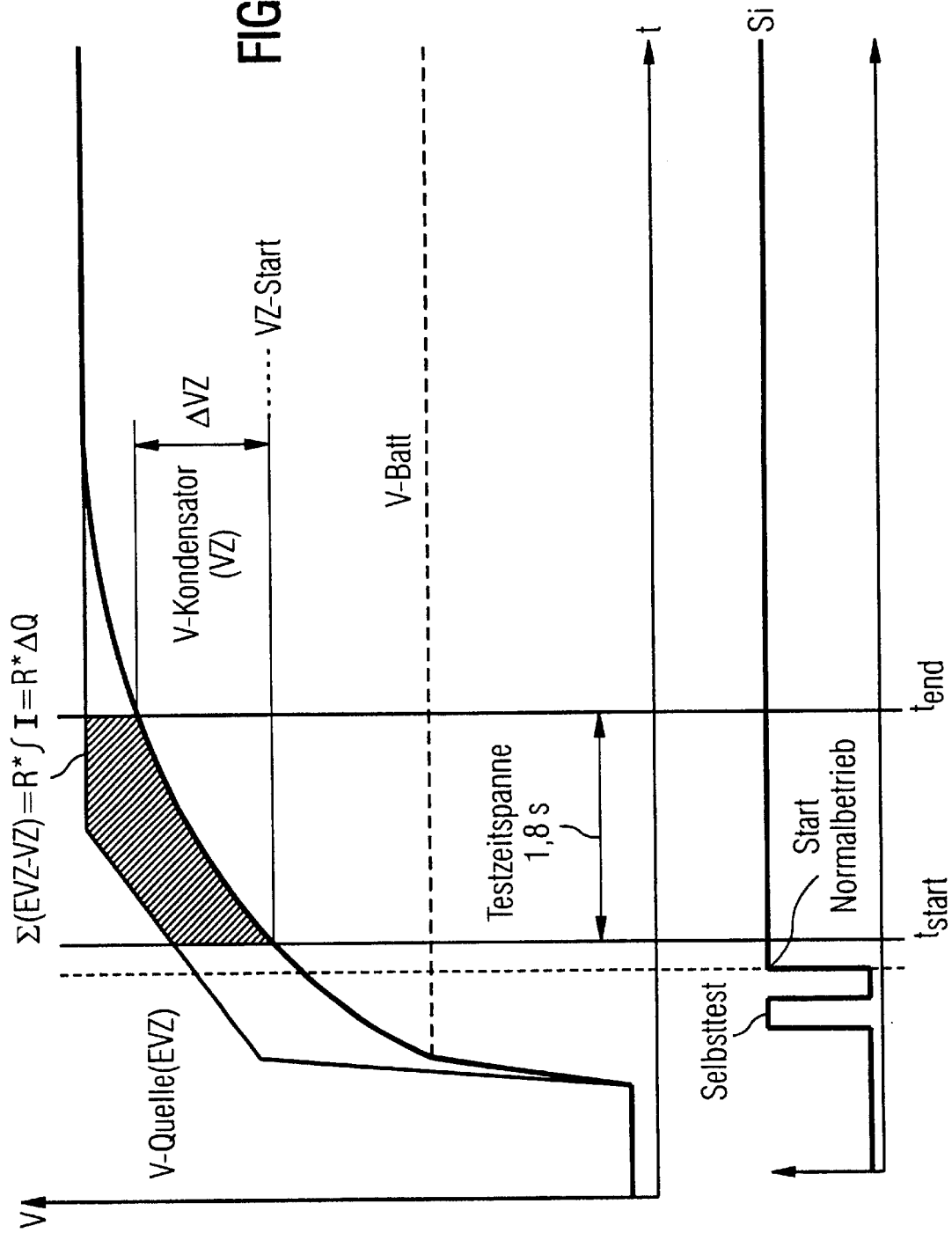
FIG. 2 is a graph of voltage profiles in the event of activation of the test apparatus according to FIG. 1.

The profiles of the capacitor voltage VZ (designated by "V-capacitor") across the firing capacitor 3 and of the source voltage EVZ (designated by "V-source") during a charging operation after activation of the occupant protection system are illustrated in the upper diagram in FIG. 2, the time t being specified on the abscissa and the respective voltage V being specified on the ordinate.

As already mentioned, the profile of a control signal Si, a logic signal, which indicates an operating state of the occupant protection system is specified in the lower diagram of FIG. 2. After activation, first of all a self-test pulse for carrying out a self-test ("Watchdog" test) of different components is output by the control signal Si. The control signal Si, which is initially set to "high", is set to "low" by the software for the purpose of resetting after the self-tests and then goes "high" again, which signifies operational capability of the system and indicates the starting of a normal mode. The test or measurement for checking the capacitance C of the firing capacitor 3 is carried out while the firing capacitor 3 is still being charged. For this purpose, shortly after the beginning of the normal mode, the test time interval is started at $t_{start}$ and the test is carried out for the intended test time interval, e.g. for 1.8 s, until the end instant $t_{end}$. The capacitor voltage VZ-start at the start instant $t_{start}$ and the capacitor voltage at the end instant $t_{end}$ are acquired in the process, in order to obtain the change ΔVZ. Formation of Σ(EVZ–VZ), the summation of the voltage drop which is acquired across the charging resistor 4 by voltage tapping and corresponds to the difference between the capacitor voltage VZ and the source voltage EVZ, over constant small sub-intervals of the interval results in a value being obtained which approximately corresponds to the integral of the charging current I over the test time interval multiplied by the resistance R and can be used to determine the charge ΔQ taken up by the firing capacitor 3 during the test time. V-batt indicates the voltage level of the on-board electrical system in the exemplary embodiment that is illustrated here.

Instead of the profile of the source voltage (V-source) EVZ as shown in FIG. 2, other profiles are also possible depending on the type of voltage source 2 or charge carrier source used. The bend points in the rising voltage shown in FIG. 2 may be due to specific properties of an integrated circuit and/or the voltage source 2 and are not necessarily the same for all integrated circuits. In principle, the use of a constant voltage source or another linear voltage profile for V-source is also conceivable. As a result of the at least approximate integral formation as described in FIG. 2, such source voltage profile differences are insignificant. Depending on the measurement technology used, it is also not necessary for both voltages EVZ and VZ to be measured, rather one voltage can be obtained from a measurement of the current through the charging resistor and from the other, measured voltage.

If, instead of the firing capacitor 3, a plurality of capacitors connected in parallel and/or in series are combined to form a storage capacitor, then provision may be made for the test apparatus to be suitable, in a manner analogous to that described, for testing the total capacitance or for testing the capacitance of each individual capacitor. As an alternative, a separate charging circuit and a separate test device may be present for each storage capacitor present in an occupant protection system.

Figure 3:
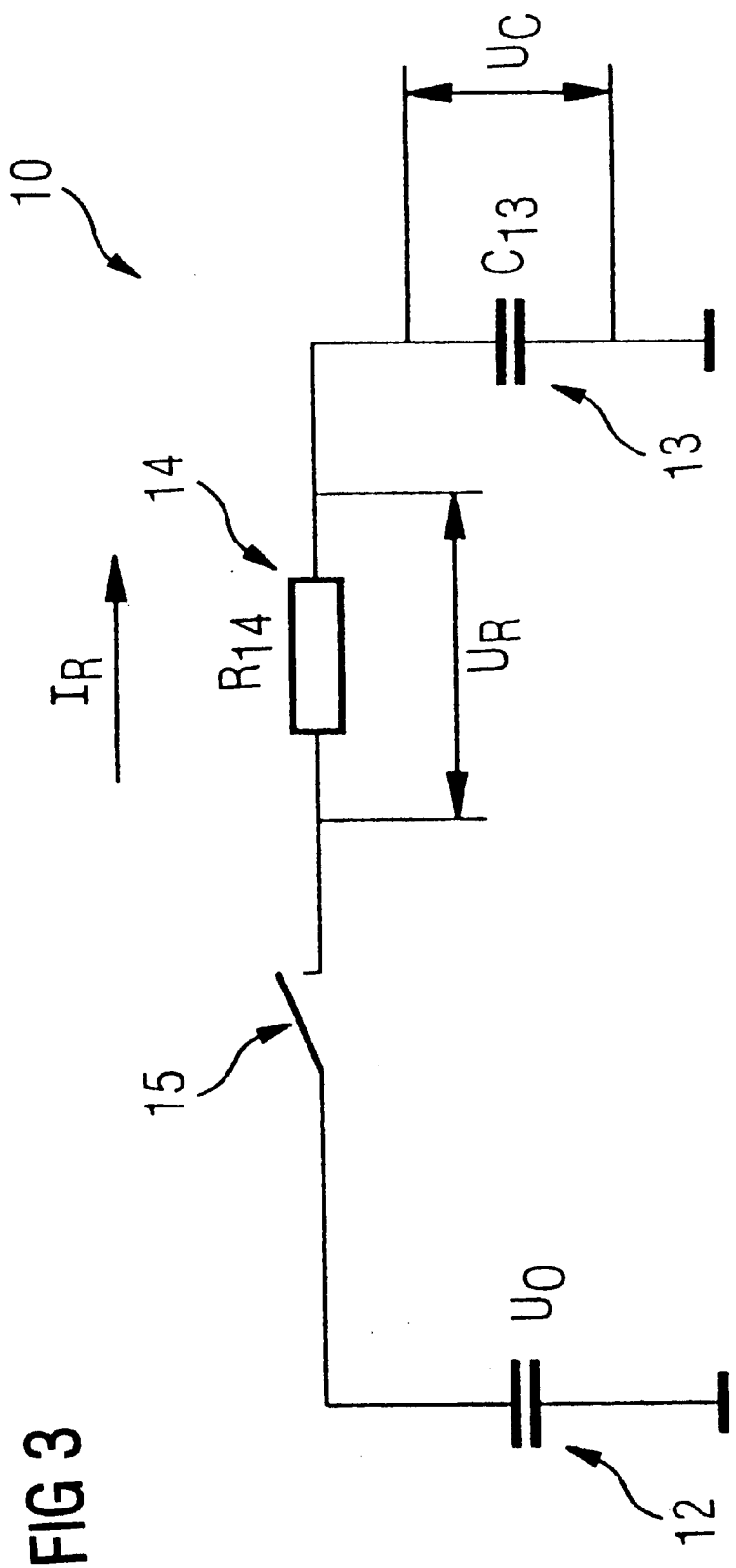
FIG. 3 is a circuit diagram of a separate charging circuit for a storage capacitor, the separate charging circuit being used in the test apparatus according to a further embodiment of the invention.

FIG. 3 shows an example of a charging circuit 10 that makes such a circuit possible. In this case, a constant voltage source 12 having a constant source voltage $U_0$ is used as a charge carrier source. A charging path, which leads via a charging resistor 14 having a resistance $R_{14}$ to a storage capacitor 13 (which may likewise be the firing capacitor), can be interrupted by a switch 15, for example a switching transistor. In the example illustrated, the switch 15 is disposed between the constant voltage source 12 and the charging resistor 14. During a charging operation initiated by closing of the switch 15, a capacitor voltage $U_c$ present across the storage capacitor 13 and a voltage UR present across the charging resistor 14 are measured, in order to derive a charging current $I_r$ from them and to determine a capacitance $C_{13}$ of the storage capacitor 13. In this case, the following equation is taken as a basis for a voltage change $\Delta U_c$ that has occurred within a measurement duration or test time interval t:

$$\Delta U_C(t) = \frac{1}{C_{13}} \int_0^t I_R(t) dt \qquad (3)$$

From (3), it follows for the capacitance that:

$$C_{13} = \frac{\int_0^t I_R(t) dt}{\Delta U_C(t)} \qquad (4)$$

In the charging phase, the following holds true to a first approximation:

$$I_R(t) \approx \frac{U_0}{R_{14}} = I_0 \qquad (5)$$

where $I_0$ is intended to symbolize a constant current.

is From (5), it follows for the voltage change $\Delta U_c$ in the capacitor voltage $U_c$ that:

$$\Delta U_C(t) \approx \frac{I_0}{C_{13}} \int_0^t dt = \frac{I_0}{C_{13}} xt = \frac{U_0}{R_{14} x C_{13}} xt \qquad (6)$$

from which the capacitance can then be determined approximately by $$C_{13} \approx \frac{U_0 xt}{R_{14} x \Delta U_C(t)} \qquad (7)$$

The inventive method for checking the capacitance can be modified in diverse ways. By way of example, in accordance with FIG. 2, it is possible to operate not with a predetermined test time interval but rather within a predetermined voltage interval ΔVZ of the capacitor, in that a start voltage VZ-start triggers the beginning of. measurement and the reaching of a predetermined end voltage triggers the end of checking or measurement.

We claim:

1. In combination with an occupant protection system, a test apparatus for testing a storage capacitor for firing a firing pellet of the occupant protection system, the test apparatus comprising:

a charge carrier source for charging a storage capacitor;

a charging resistor having a resistance connected between said charge carrier source and the storage capacitor; and a measuring device for determining a capacitance of the storage capacitor and having a voltage change acquisition device for determining a voltage change in a capacitor voltage and a charge change acquisition device for determining a charge change in a capacitor charge during the change in voltage, said measuring device further having a control device which initiates a measurement of the voltage change and of the charge change in the storage capacitor during a charging phase of the storage capacitor by said charge carrier source, the charging phase having a varying gradient.

2. The test apparatus according to claim 1, wherein said control device initiates the measurement during a predetermined test time interval.

3. The test apparatus according to claim 1, wherein said charge change acquisition device has an integrating device for at least approximate integration of a value corresponding to a charging current of the storage capacitor for a measurement duration.

4. The test apparatus according to claim 1, wherein said voltage change acquisition device acquires the capacitor voltage at a terminal connecting the storage capacitor to said charging resistor.

5. The test apparatus according to claim 4, wherein said charge carrier source has an output and said voltage change acquisition device determines a source voltage at said output of said charge carrier source, said output connected to said charging resistor, and said charge change acquisition device determines a charging current from said resistance of said charging resistor and from a difference between the source voltage and the capacitor voltage.

6. In an occupant protection system, a method for checking a capacitance of a storage capacitor for firing a firing pellet of the occupant protection system, which comprises:

determining a charging current from a voltage drop across a charging resistor and a resistance of the charging resistor, the charging resistor connected between a charge carrier source and a storage capacitor;

determining a quotient from a change in a charge of the storage capacitor and an associated change in a voltage of the storage capacitor during a charging phase of the storage capacitor, the charging phase having a varying gradient; and determining a capacitance of the storage capacitor from the quotient.

7. The method according to claim 6, which comprises determining the change in the charge of the storage capacitor by integration of the charging current during a test time interval within the charging phase.

8. The method according to claim 1, which comprises:

measuring the voltage of the storage capacitor at a terminal connecting the storage capacitor to the charging resistor;

using the voltage of the storage capacitor to assist in acquiring the voltage drop across the charging resistor;

using the voltage of the storage capacitor to determine the associated change in the voltage of the storage capacitor; and using the voltage of the storage capacitor to assist in determining a functionality of the storage capacitor.

9. The method according to claim 1, which comprises obtaining the capacitance of the storage capacitor using the formula $$C = \Delta Q / \Delta VZ$$

where $$\Delta Q = \int I x dt = R^{-1} \times \int (EVZ - VZ) x dt \qquad (1)$$

where C is the capacitance to be determined, $\Delta Q$ is a charge change between a beginning and an end of the test time interval, $\Delta VZ$ is a voltage change in the storage capacitor voltage, the voltage change formed by forming a difference between storage capacitor voltages between the beginning and the end of the test time interval, I is a charging current, R is the resistance of the charging resistor and EVZ–VZ is the voltage drop across the charging resistor.

* * * * *